(12) United States Patent
Hook et al.

(10) Patent No.: US 6,256,755 B1
(45) Date of Patent: Jul. 3, 2001

(54) APPARATUS AND METHOD FOR DETECTING DEFECTIVE NVRAM CELLS

(75) Inventors: Terence B. Hook, Jericho Center; Chung H. Lam, Williston, both of VT (US); Eric S. Lee, Beaverton, OR (US); James S. Nakos, Essex Junction, VT (US); Nivo Rovedo, Lagrangeville, NY (US); Richard Q. Williams, Essex Junction, VT (US); Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/174,789

(22) Filed: Oct. 19, 1998

(51) Int. Cl.[7] .................................................. G11C 29/00
(52) U.S. Cl. ............................................ 714/718; 365/200
(58) Field of Search ............................ 714/718; 635/185, 635/218, 200

(56) References Cited

U.S. PATENT DOCUMENTS

| 5,043,940 | 8/1991 | Harari | 365/168 |
|---|---|---|---|
| 5,053,990 | 10/1991 | Kreifels et al. | 364/900 |
| 5,095,344 | 3/1992 | Harari | 357/23.5 |
| 5,138,580 | 8/1992 | Farrugia et al. | 365/218 |
| 5,168,465 | 12/1992 | Harari | 257/320 |
| 5,268,870 | 12/1993 | Harari | 365/218 |
| 5,369,615 | 11/1994 | Harari et al. | 365/218 |
| 5,428,569 | 6/1995 | Kato et al. | 365/185 |
| 5,434,825 | 7/1995 | Harari | 365/185 |
| 5,485,423 | 1/1996 | Tang et al. | 365/185 |
| 5,561,632 | 10/1996 | Arase et al. | 365/185 |
| 5,568,439 | 10/1996 | Harari | 365/218 |
| 5,926,520 | * 7/1999 | Yano | 377/80 |

* cited by examiner

Primary Examiner—Phung M. Chung
(74) Attorney, Agent, or Firm—Connolly Bove Lodge & Hutz

(57) ABSTRACT

An apparatus and method for detecting a defective array of NVRAM cells. A counter is provided which times an erase time interval for the NVRAM cells during a regular erase function. The computed erase interval is compared with a maximum erase interval to determine at least a first characteristic which indicates the block of NVRAMs is at the end of its useful life. A second characteristic is determined by computing the slope in the erase time function versus the number of simulated erase functions. When the slope of the erase function exceeds a maximum slope, the NVRAM array is determined to be at the end of its useful life.

12 Claims, 4 Drawing Sheets

APPARATUS AND METHOD FOR DETECTING DEFECTIVE NVRAM CELLS

BACKGROUND OF THE INVENTION

The present invention relates to the detection of imminent failures of an array of NVRAM cells. Specifically, a circuit is described which will monitor the degradation of an array of NVRAM cells so that a timely replacement of the array may be made.

NVRAM arrays are commonly found in devices such as portable calculators, smart cards and medical record storage devices. In the smart card application they are typically used as a permanent memory to store specific transaction data which is necessary for using the smart card. Each cell of the NVRAM may be of the type which comprises a stacked gate cell formed from a floating gate structure located under a control gate, with a source and drain diffusion region on either side of the gate structures. Each stacked gate cell of the array is programmed by storing a charge representing a digital binary 1 value in the a floating gate of the cell. The NVRAM cells are erased by applying a common erasing potential to the sources of all the cell transistors in the NVRAM array.

NVRAM arrays, however, have a limited life. Each successive erasure of an NVRAM cell tends to degrade the cell so that erasure becomes more difficult with time. NVRAM cells fail catastrophically as they degrade, and if the failure is not accurately predicted, valuable data may be lost from the NVRAM array. The time it takes to erase a programmed cell by removing the charge from the floating gate is an endurance factor which represents the useful life of the array. one known technique for avoiding the catastrophic failure of NVRAM cells, the number of times that the array of NVRAM cells has been erased is used as a predictor of catastrophic failure. When the total erasure count reaches a predetermined experimentally derived value, it is deemed time to replace the NVRAM array in order to avoid a catastrophic failure.

The foregoing technique is disadvantageous in that it can result in the replacement of an array of NVRAM cells prematurely when a significant amount of life remains in the NVRAM cells.

SUMMARY OF THE INVENTION

It is an object of this invention to provide a method to test NVRAM cells for a potential defect.

It is a more specific object of this invention to monitor the degradation of NVRAM cells over time to identify a potential catastrophic failure.

These and other objects of the invention are accomplished in a method and apparatus which continually measures the degradation of individual cells of an NVRAM array. The degradation of the NVRAM array is determined by monitoring the change in erasure characteristics over time. As the erasure characteristics of each cell reach a particular threshold, a flag is set warning the user that continued use may result in a catastrophic failure of the NVRAM array.

In a first embodiment of the invention, two characteristics representing the degradation of the NVRAM array are monitored. The first is the erasure time which increases during normal use of the NVRAM array. The erasure time is compared with a threshold and used to indicate an imminent failure. The change in erasure time as a function of number of erasures, representing an erasure acceleration, is used as the second characteristic to detect a potential failure in the NVRAM cell array. When either characteristic exceeds a respective threshold, the potential failure of the NVRAM cell array is regarded as imminent.

DESCRIPTION OF THE PREFERRED EMBODIMENT

Figure 1:
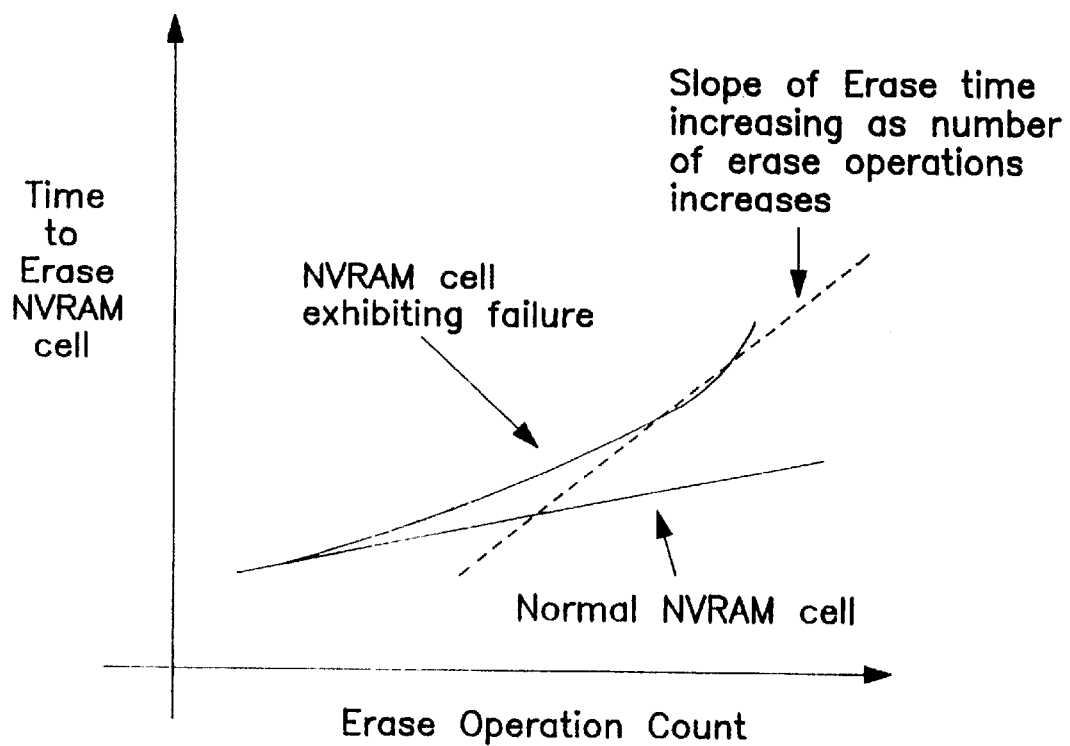
FIG. 1 illustrates the time for erasing an NVRAM cell as the number of erase operations increases.

FIG. 1 illustrates the characteristics of an NVRAM cell which change over time, where the erase time is shown, as a function of the number of erase operations. Devices having an NVRAM array periodically erase the NVRAM array. Erasure of the NVRAM array represents a condition where the charge in the floating gate of each stacked gate constituting each cell is removed. The removal of the charge occurs by applying pulses to a common source connection of each of the NVRAM cells which removes the charge from each of the floating gates, thereby lowering the threshold voltage for each NVRAM cell. As is known in the art, the erasure of an NVRAM cell is detected when the voltage threshold Vt of the floating gate transistor drops below a given threshold value.

Over time, more pulses applied to the common source connection are needed to remove the charge in the floating gate, and the time to erase an NVRAM cell may be represented by the number of pulses needed to achieve a reduction in device threshold voltage Vt.

FIG. 1 illustrates the time for erasure as a function of the number of erasures over the life of a NVRAM cell for a normal NVRAM cell, and the erasure time for a cell exhibiting an imminent failure. The NVRAM cell exhibiting an imminent failure takes a longer time to erase, and has an increased erase acceleration factor, i.e., a change in slope of the erasure time versus erasure count function. The erasure time as well as the erase acceleration may be used as a threshold for detecting imminent failure. The current embodiment of the invention selects as an erase acceleration threshold which is equal to the slope shown in FIG. 1. If the erase acceleration increases beyond that illustrated in the dotted line of FIG. 1, an imminent failure is predicted. Alternatively, the time for erasure may be used as a threshold function for identifying an imminent failure of an NVRAM cell of the NVRAM array.

Figure 2:
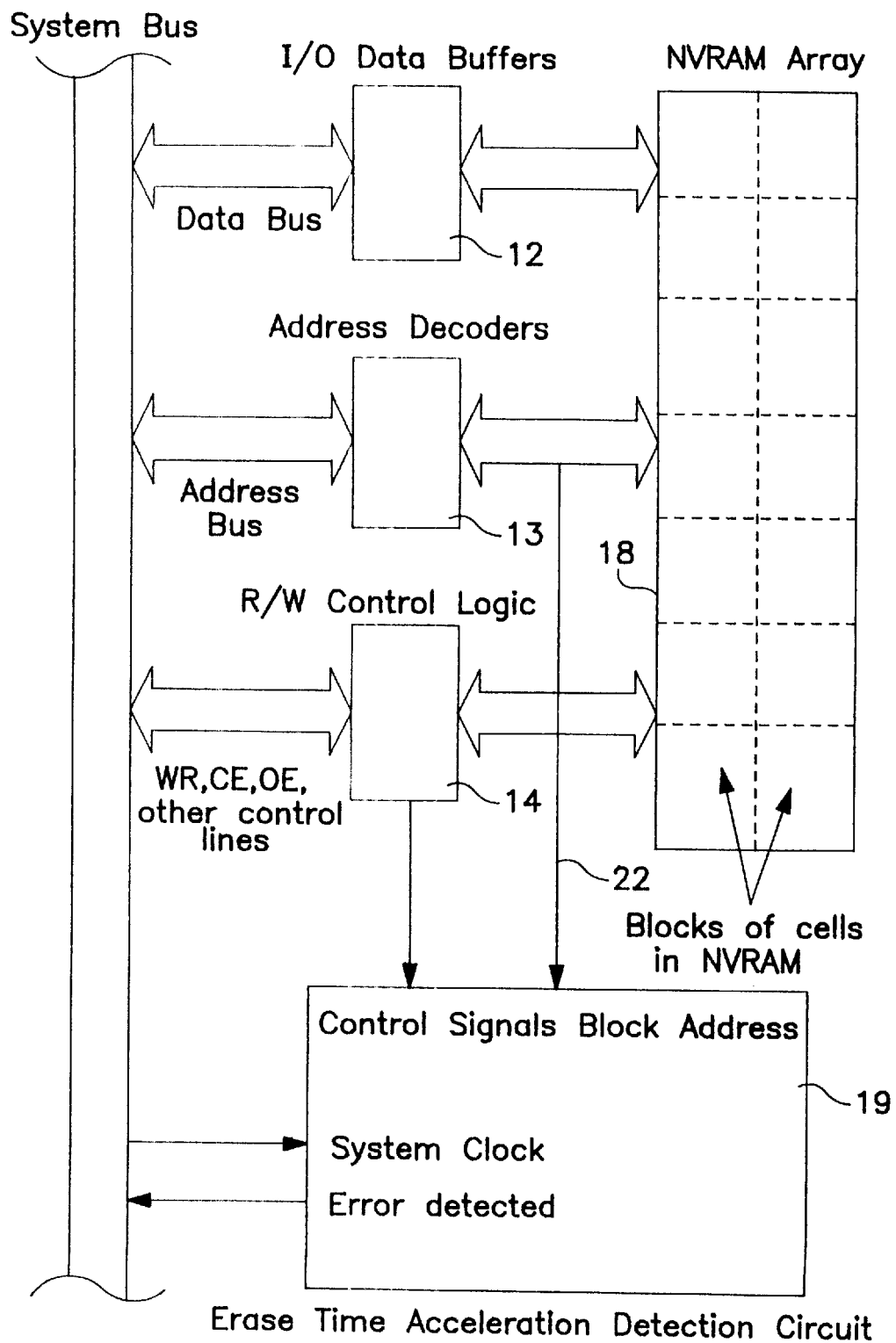
FIG. 2 illustrates an apparatus in accordance with one embodiment of the invention for monitoring the erase time, and erase acceleration of an NVRAM array.

In order to carry out the invention in accordance with the preferred embodiment, both the erase acceleration and total erase time for the entire array, rather than on an individual cell basis are used as alternative thresholds for identifying the time to replace the NVRAM array. FIG. 2 illustrates the basic system architecture of a system which stores and retrieves data from an NVRAM array having a detection circuit which identifies the imminent failure of the NVRAM array. Data are transferred between the NVRAM array 18 and the system bus 11. Conventional I/O data buffers 12 store the data transfer in both a READ operation, wherein data is transferred from the NVRAM array 18 to the bus 11, and a WRITE operation in which data is transferred from the bus 11 for storage in NVRAM array 18. Address decoders 13 provide the address locations in the NVRAM array 18 for storing the data temporarily located in I/O data buffers 12. Read/write control logic circuit 14, operating under control of the system bus, will enable the NVRAM 18 to either read data from it, or write data to it.

The NVRAM array 18 erase time or "endurance" is constantly monitored with the circuit 19. Since the programming voltage applied to the NVRAM array can influence the erase time, it is assumed that the voltage will be maintained substantially constant. A control signal on line 21 from the read/write control logic 14 represents the erasure time for the entire NVRAM array 18 which is coincident with an address on line 22 corresponding to a global address for the cells of the NVRAM array 18. Together control signals 21, 22 indicate the erasure process for all of the cells of the array 18. A system clock input is provided to the erase acceleration detection circuit 19. The system clock may be used as a timing signal which measures the length of the erasure interval on line 21, from which the erasure acceleration may be determined. Alternatively, an on board oscillator may be provided as a source of timing signals. When either of these quantities, either erase time or erase time acceleration, exceeds preestablished levels, a flag is posted for alerting the user that the NVRAM array has reached the end of its useful life and should be replaced.

Figure 3:
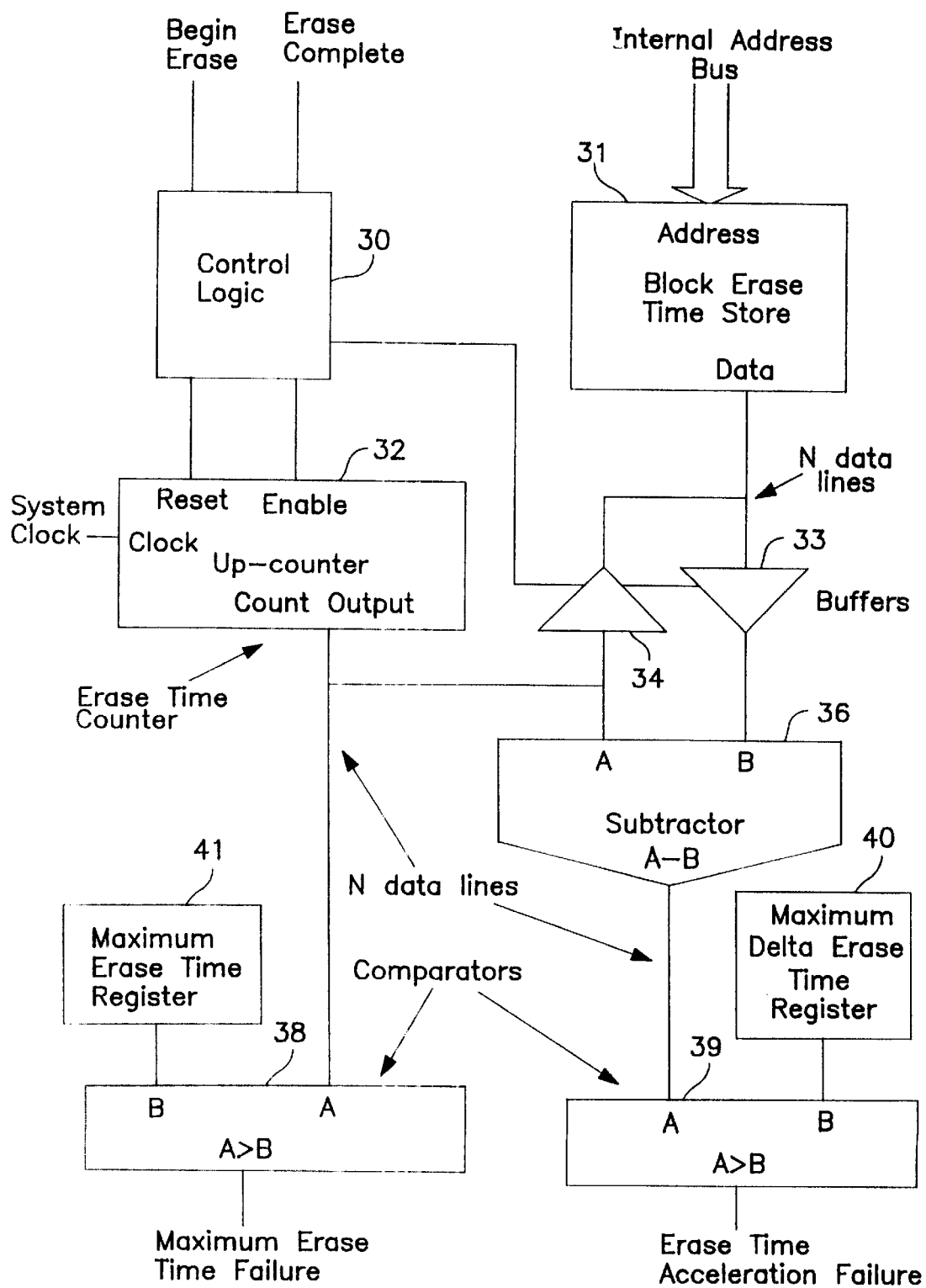
FIG. 3 illustrates an apparatus for monitoring the erase time and erase acceleration for an NVRAM array.

The detection circuit 19 is shown more completely in FIG. 3. The process of monitoring the erase time begins when an erase function is initiated by the READ/WRITE control logic which occurs by applying pulses to the source connection of each NVRAM cell. The threshold value for each of the NVRAM cells is determined following each pulse. When all cells have attained a voltage threshold below the reference threshold, the erasure of all of the cells is thereby verified.

The control logic 30 of FIG. 3 receives a pulse, indicating the beginning of the erase function, as well as an erase complete pulse indicating that the voltage threshold for each NVRAM cell is below reference, indicating the entire array is erased. The interval of time between the beginning of an erase function and the completion of the erase function is measured with counter 32. Counter 32 is reset when the erase function begins and accumulates clock pulses from the system clock. The erase complete indication disables counting by the erase time counter 32, providing a count representing the time for erasure.

The count obtained from the erasure time for the NVRAM array is stored in an erase time storage register 31 through buffer 34. A subtractor circuit 36 subtracts the current time for erasure from a previous time of erasure stored in the array erase time storage register 31. Storage register 31 may be a small NVRAM array. The result represents an erase time acceleration, representing the slope of the erase time versus total number of erasures of FIG. 1. The resulting erase time acceleration figure is compared in comparator 39 with a maximum erase time acceleration (Delta) stored in register 40. Registers 40 and 41 may for instance be hard wired or fuse-programmed. In the event that the erase acceleration or slope of the erase time function exceeds the Delta, a failure is posted by comparator 39.

As an additional measure of the NVRAM susceptibility to failure, the total erase time is compared in comparator 38 with a maximum erase time in register 41. In the event the erase time exceeds the maximum, a flag is posted indicating the end of useful life of the NVRAM array.

The foregoing logic circuit is implemented with the NVRAM array so that the characteristics of the NVRAM array may be monitored every time an erase function is executed. In this way, normal use of the NVRAM device provides a constant indication of its life expectancy, which is continuously updated and used to generate a replacement flag.

Figure 4:
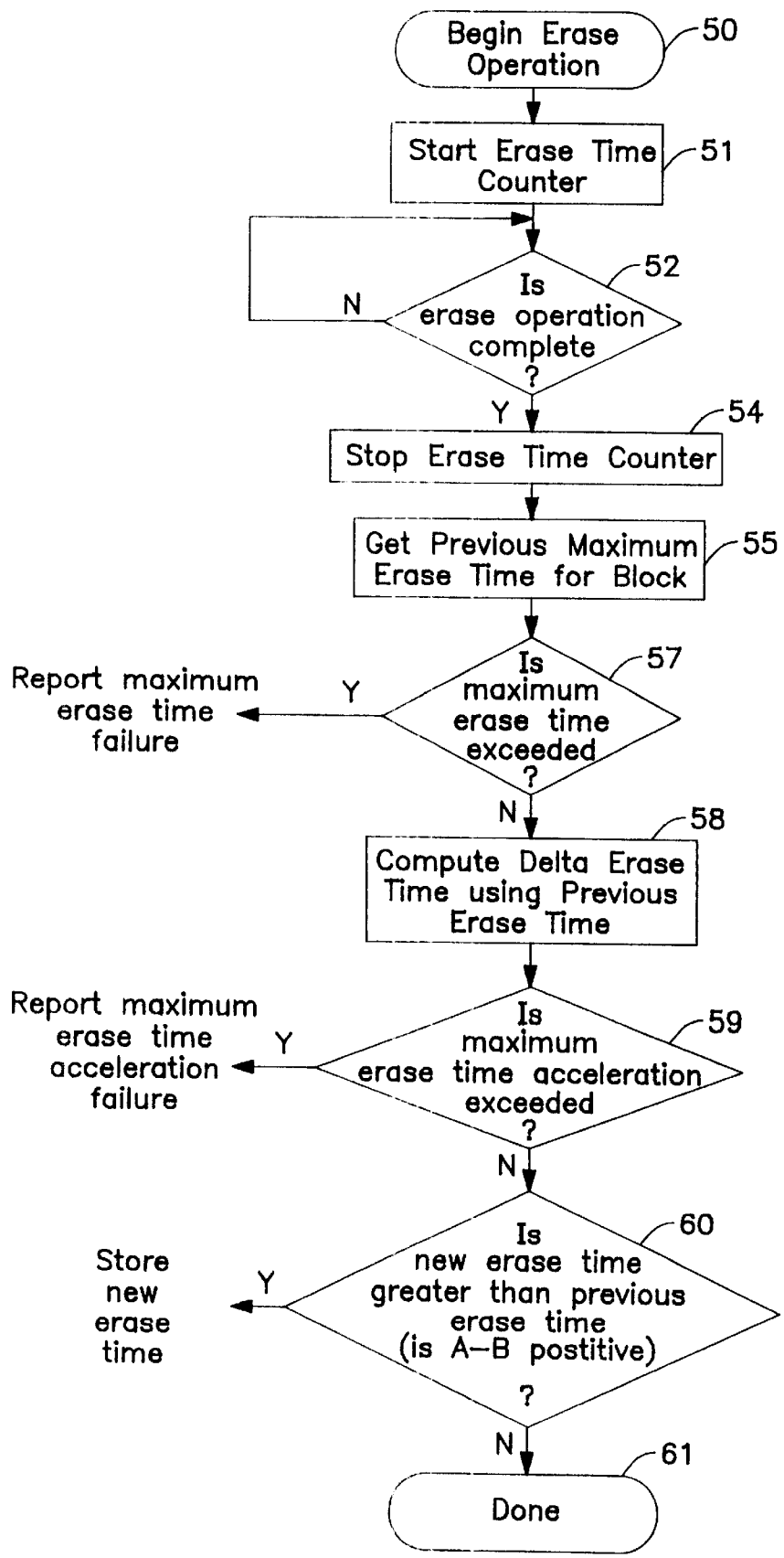
FIG. 4 is a flowchart of the operation of the apparatus of FIG. 3 for determining a failure from the erase time or from the erase acceleration.

FIG. 4 is a more detailed description of the process executed by the apparatus of FIG. 3. Referring now to FIG. 4, the process begins with step 50 when the NVRAM array is undergoing an erase operation. The erase time counter is started in 51. Once the erase operation is completed as determined in step 52, the erase time counter is inhibited in step 54 from accumulating any further system clock pulses. The maximum erase time is then recovered from register 41 in step 55 and used as a reference erase time.

Decision block 57 determines whether the maximum erase time has been exceeded. If so, a flag is set indicating that the NVRAM array has reached the end of its useful life.

If the erase time is still below the maximum erasure time, the Delta, or erase acceleration factor of the erase time is determined in step 58 as the difference between the currently computed erase time and a previously computed erase time. A comparison is made in step 59 whether a maximum erase acceleration has been exceeded. If it has, this results in a flag being set to indicate that the NVRAM array has reached the end of its useful life.

Decision block 60 determines whether a new erase time is greater than the previous erase time. If it is it becomes a new reference value stored in register 31. The process ends in step 61, until such time as the NVRAM array is subject to a subsequent erase function.

Thus, the foregoing embodiment provides for a determination of the end of useful life for the NVRAM array, by continuously monitoring the array's erase function characteristics. While slope and time for erasure are in accordance with the preferred embodiment the two characteristics monitored, those skilled in the art will recognize other characteristics which may be continuously monitored to obtain an indication of the end of the NVRAM array useful life.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for detecting the end of the life of an NVRAM array comprising:

determining an erase time function for said NVRAM array; and determining from a characteristic of said function when said NVRAM is susceptible to imminent failure.

2. The method according to claim 1 wherein said characteristic is the most recent time of erasure for said NVRAM array.

3. The method according to claim 1 wherein said characteristic is the slope of said function.

4. The method for detecting, the end of the life of an NVRAM ray according to claim 1 wherein said erase time function is determined by monitoring, the threshold voltage of each NVRAM cell and measuring the time it takes said threshold voltage to reach a predetermined reference value.

5. A method for determining the end of useful life for an NVRAM array comprising:

measuring the time for erasing said NVRAM array; and comparing said time for erasing with a predetermined maximum erase time, whereby an erase time which exceeds said predetermined maximum erase time indicates a potentially defective NVRAM array.

6. The method for testing according to claim 5 further comprising:

subtracting said time for erasing said NVRAM array from a reference time for erasing said NVRAM array to derive an erase acceleration time; and comparing said erase acceleration time with a stored erase acceleration time to detect a defective array.

7. The method for testing according to claim 6 further comprising:

storing a previously determined erase time as said reference time.

8. The method for testing according to claim 6 further comprising:

storing a subsequently measured erase time as a reference time if said subsequently measured erase time is greater than said previously measured erase time.

9. An apparatus for detecting an end of useful life of an NVRAM array comprising:

a counter which times an erase interval for said array; and a comparator for comparing said erase interval with a maximum erase interval, said comparator providing an indication that said NVRAM array is defective when said erase interval exceeds said maximum erase interval.

10. The apparatus according to claim 9 further comprising:

a subtractor circuit for measuring the difference between consecutive erase times; and a second comparator for determining whether said difference between said consecutive erase intervals exceeds a maximum erase interval differential, whereby a second indication of the end of useful life of an NVRAM array is produced.

11. The apparatus according to claim 10 further comprising:

a register for storing each measured erase interval produced by said counter, said register providing a previously measured erase interval to a first input of said subtractor circuit and said counter providing a subsequently measured time interval to a second input of said subtractor circuit.

12. The apparatus for detecting an end for useful life of an NVRAM array according to claim 9 further comprising means for monitoring the threshold voltage of each new cell of an NVRAM array to determine when said array has been erased while said counter times said erase interval.

* * * * *